(12) United States Patent
Chang et al.

(10) Patent No.: US 9,064,550 B2
(45) Date of Patent: Jun. 23, 2015

(54) METHOD AND APPARATUS FOR WORD LINE SUPPRESSION

(75) Inventors: Jonathan Tsung-Yung Chang, Hsinchu (TW); Chiting Cheng, Taichung (TW); Chien-Kuo Su, Luzhu Township (TW); Chung-Cheng Chou, Hsin-Chu (TW); Jack Liu, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 427 days.

(21) Appl. No.: 13/279,375

(22) Filed: Oct. 24, 2011

(65) Prior Publication Data
US 2013/0100730 A1   Apr. 25, 2013

(51) Int. Cl.
  G11C 11/00   (2006.01)
  G11C 8/08    (2006.01)
  G11C 11/418  (2006.01)
(52) U.S. Cl.
  CPC .............. G11C 8/08 (2013.01); G11C 11/418 (2013.01)
(58) Field of Classification Search
  CPC .... G11C 14/0054; G11C 11/412; G11C 8/16; G11C 7/1075; G11C 11/418; G11C 8/08
  USPC ..................... 365/154, 156, 185.23
  See application file for complete search history.

(56) References Cited

U.S. PATENT DOCUMENTS

| | | | |
|---|---|---|---|
| 6,639,826 B2 * | 10/2003 | Houston | 365/154 |
| 7,505,345 B2 | 3/2009 | Wang et al. | |
| 7,558,145 B2 * | 7/2009 | Rao et al. | 365/154 |
| 2007/0030722 A1 * | 2/2007 | Chanussot et al. | 365/154 |

OTHER PUBLICATIONS

Morimura, "A Step-Down Boosted-Wordline Scheme for 1-V Battery-Operated Fast SRAM's", IEEE Journal of Solid-State Circuits, vol. 33, No. 8, Aug. 1998, pp. 1220-1227.*
Pilo, H. et al., "A 64Mb SRAM in 32nm High-k Metal-Gate SOI Technology with 0.7V Operation Enahbled by Stability, Write-Ability and Read-Ability Enhancements", IEEE International Solid-State Circuits Conference, 2011, Session 14, HIgh-Performance Embedded Memory/14.1, pp. 254-256.
Khellah, M. et al., "Read and Write Circuit Assist Techniques for Improving Vccmin of Dense 6T SRAM Cell", IEEE International Conference on Integrated Circuit Design and Technology and Tutorial, Jun. 2008, pp. 185-188.

* cited by examiner

Primary Examiner — Vanthu Nguyen
Assistant Examiner — Khamdan Alrobaie
(74) Attorney, Agent, or Firm — Duane Morris LLP

(57) ABSTRACT

A memory access operation on a bit cell of a digital memory, e.g., a static random access memory (SRAM), is assisted by reducing the word line control voltage for reading and boosting it for writing, thus improving data integrity. The bit cell has cross coupled inverters for storing and retrieving a logic state via bit line connections through a passing gate transistor controlled by the word line. A level of a word line signal controlling the passing gate transistor is shifted from a first voltage value to a higher second voltage value to begin a memory access cycle. The level of the word line signal is shifted from the second voltage value to a third voltage value less than the second voltage value during the access cycle. The word line signal is maintained at the third voltage value for a time interval during the access cycle.

21 Claims, 7 Drawing Sheets

METHOD AND APPARATUS FOR WORD LINE SUPPRESSION

BACKGROUND

Static random access memory (SRAM) is a type of volatile semiconductor memory that stores data bits using bistable circuitry that does not need refreshing. An SRAM cell may be referred to as a bit cell because it stores one bit of information, represented by the logic state of two cross coupled inverters. Memory arrays include multiple bit cells arranged in rows and columns. Each bit cell in a memory array typically includes connections to a power supply voltage and to a reference voltage. Logic signals on bit lines control reading from and writing to a bit cell, with a word line controlling connections of the bit lines to the inverters, which otherwise float. A word line may be coupled to the bit cells in a row of a memory array, with different word lines provided for different rows.

A bit cell in an SRAM configuration known as six-transistor (6T) includes a pair of access transistors PG1 and PG2 switched by a signal on a word line WL and providing access to a pair of cross-coupled inverters, specifically by coupling signals on bit lines to complementary nodes of the cross-coupled inverters during read and write operations. "PG" in PG1 and PG2 may stand for "passing gate" because those transistors pass signals on the bit lines to the nodes of the cross coupled inverters when the word line signal at the gate terminal of transistors PG1 and PG2 becomes true (typically logical high on the gates of NMOS FETs). During standby mode, word line WL is not asserted (logical low), and the access transistors PG1 and PG2 disconnect the bit cell from the bit lines. The cross-coupled inverters are coupled to the power supply and reinforce each other to maintain one of two possible logic states with a stored data bit represented by the voltage at one of the nodes of the inverters and the complement of that bit at an other node of the inverters. It is an understood convention that while complementary data values are stored at each of these nodes, the bit stored at one of the nodes is referred to as the bit value stored at the bit cell.

For a read operation, both bit lines of a bit cell are precharged high, and the word line WL is asserted. The stored data bit at one of the nodes (the node that stores the data bit of the bit cell, per the above-mentioned convention) is transferred to one of the bit lines BL, and the data bit at the other node is transferred to the other bit line BLB (which stands for "bit line bar", or bit line complement). A sense amplifier discerns which of BL and BLB is higher and which is lower, thereby determining the logic value stored in the bit cell. For a write operation, the value to be written is provided at BL, and the complement of that value is provided at BLB, when the word line WL is asserted.

During a read operation (read cycle), the correct (intended) functionality is that the data at the storage nodes in a bit cell remains unchanged while being read. But in some instances the storage nodes may undesirably interchange (swap) logic values, causing the bit cell to flip from one logic state to the other. Such an undesirable occurrence may be referred to as a "read flip" and may be due to various factors, e.g., storage device mismatch (e.g., imbalance in the strengths of transistors that form the bit cell) or a large amount of charge rushing into a storage node when a word line is asserted, thereby overwhelming the device. Read flips introduce errors in the data stored in the SRAM.

A known approach for addressing the issue of read flips is to reduce the constant level at which the word line is asserted. This approach is referred to as "under-drive" because the word line is driven at a lower level than when it is normally driven (i.e., WL is driven at a voltage level less than its normal level). For example, if the word line is ordinarily driven at a constant voltage of 5 V throughout a read or write cycle, the under-drive scenario may involve driving the word line at a constant level of 4 V (or some other constant fraction of 5 V) throughout the cycle. Under-driving the word line may reduce or eliminate the occurrence of read flips, by improving the static noise margin for read operations, but the under-drive approach has its own disadvantages. First, asserting WL at a reduced level (e.g., 4 V instead of 5 V) slows down the read operation, as it takes longer for a bit line BL to acquire its final value that corresponds to the value stored in the bit cell. Second, under-drive may reduce the occurrence of read flips at the expense of undesired functionality during write cycles, namely, increasing the probability of failure to write an opposite value successfully into the bit cell when attempted. If the bit cell originally stores a value of '1', an attempt to write a '0' into the bit cell (i.e., to swap the values stored at the storage nodes) may be unsuccessful because of a write margin issue introduced by the under-driven word line. In other words, the benefit of avoiding undesired read flips by using the word line under-drive approach comes at the cost of failing to perform desired "write flips."

The power supply voltage to the bit cell is also pertinent. The lowest $V_{DD}$ voltage (positive power supply voltage) at which an SRAM bit cell may function is referred to as Vccmin. Having a low cell $V_{DD}$ near Vccmin reduces leakage current and also reduces the incidence of read flips. Having a high cell $V_{DD}$ improves the probability of successful write operations. By choosing a voltage for the constant WL underdrive level, one may seek a balance (tradeoff) between the read Vccmin and the write Vccmin, but what is needed is a solution for improving both the read Vccmin and the write Vccmin.

SUMMARY

In an embodiment disclosed herein, a method is disclosed for assisting a memory access operation on a bit cell of a digital memory by using different voltage levels for the logical high signal on the word lines WL at different phases of memory access operations. The bit cell has cross coupled inverters configured for storing and retrieving a logic state via bit line connections through a passing gate transistor controlled by a word line. A level of a word line signal controlling the passing gate transistor is shifted from a first voltage value to a second voltage value higher than the first voltage value to begin a memory access cycle at the bit cell. The level of the word line signal is shifted from the second voltage value to a third voltage value less than the second voltage value during the access cycle. The word line signal is maintained at the third voltage value for a time interval during the access cycle.

In an embodiment, an SRAM access assist apparatus includes an SRAM bit cell, a word line coupled to the bit cell, a word line driver circuit, a switch, and a control module. The bit cell can include cross coupled inverters configured for storing and retrieving a logic state. The bit cell is accessible via bit line connections through a passing gate transistor of the bit cell. The passing gate transistor is controlled by the word line. The word line driver circuit is configured to provide a word line signal at the word line to drive the bit cell during a memory access cycle, which may be a read or a write cycle. The switch is configured to selectively load said word line to a ground node. The control module is configured to control the switch during the access cycle. The control module is configured to open the switch during a first time interval of the access cycle and close the switch to suppress the word line signal, i.e., to reduce the amplitude of the word line signal, during a second time interval of the access cycle after the first interval.

A method of controlling a signal includes providing a word line signal at a logical low voltage at a word line. The word line is coupled to a positive power supply voltage to begin a memory access cycle at a memory bit cell. After the word line signal has reached a substantially constant value, the word line signal is loaded during the access cycle to pull down the voltage at the word line.

BRIEF DESCRIPTION OF THE DRAWINGS

The following will be apparent from elements of the figures, which are provided for illustrative purposes and are not necessarily to scale.

DETAILED DESCRIPTION

This description of certain exemplary embodiments is intended to be read in connection with the accompanying drawings, which are to be considered part of the entire written description.

Various embodiments of the present disclosure address the foregoing deficiencies of the prior art. A high probability of success in data retention, under the stress of read operations, is provided by adjusting the amplitude of word line signaling during phased parts of memory access cycles, such as read and write cycles. The integrity of stored memory contents is protected during read cycles without negatively impacting write cycles. Power consumption is reduced in various embodiments to promote efficient resource usage.

Figure 1:
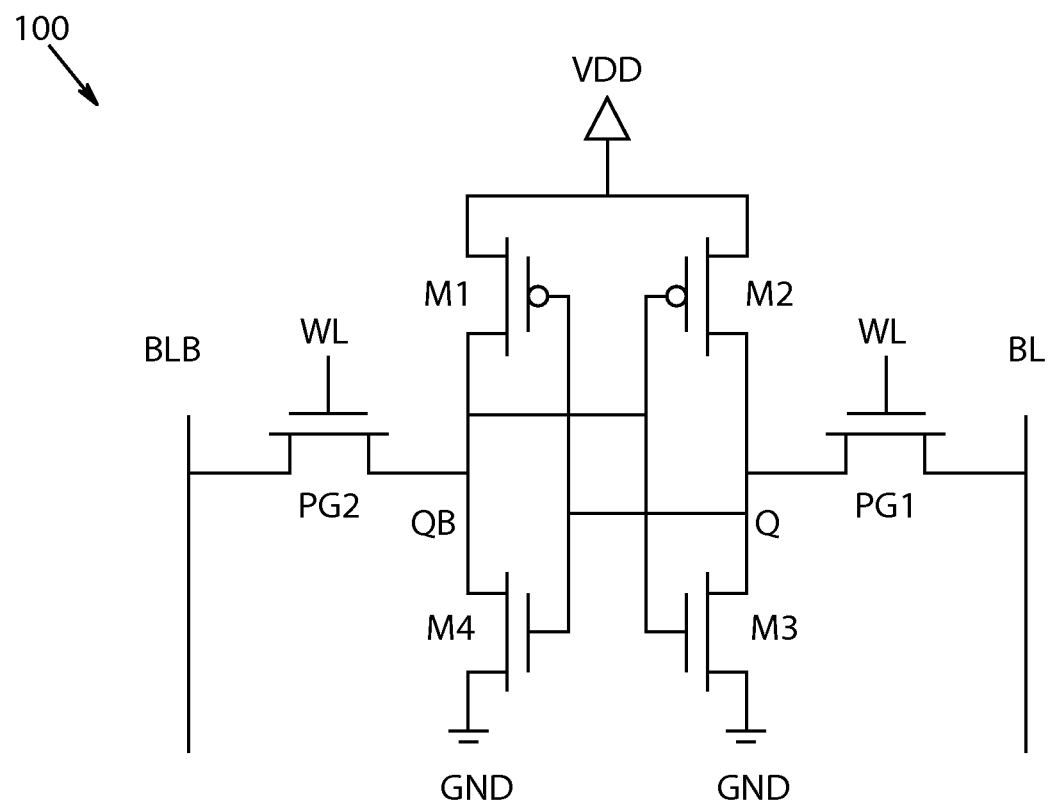
FIG. 1 is a schematic diagram of a static random access memory (SRAM) bit cell in a six-transistor (6T) configuration.

FIG. 1 is a schematic diagram of a static random access memory (SRAM) bit cell 100 in a six-transistor (6T) configuration. The present disclosure is applicable for this and other configurations to improve on deficiencies of prior art techniques and to improve read assist mechanisms for bit cell 100 in ways that avoid a negative impact on write performance. Bit cell 100 includes a pair of cross-coupled CMOS inverters formed by transistors M1, M2, M3, and M4 as shown in FIG. 1. Passing gate (access) transistors PG1 and PG2 selectively couple storage nodes Q and QB to a bit line BL and a complementary bit line BLB, respectively, as shown. Transistors PG1 and PG2 are driven (controlled) by a word line WL coupled to the gates of transistors PG1, PG2. The value (data bit) stored at node Q may be the logic value stored by bit cell 100.

Figure 2:
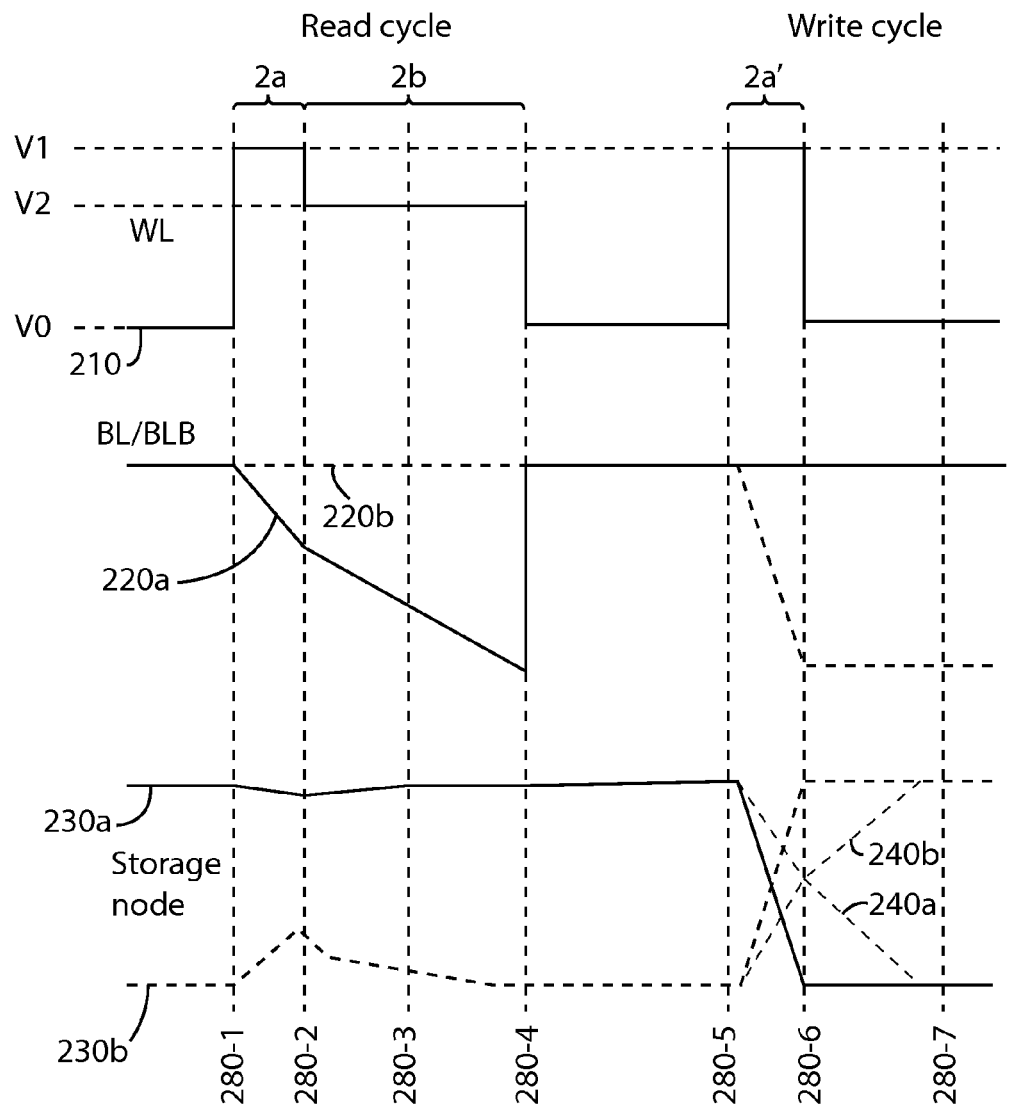
FIG. 2 is an example signal trace diagram for a word line, bit line, and storage nodes in accordance with an exemplary embodiment.
Figure 3:
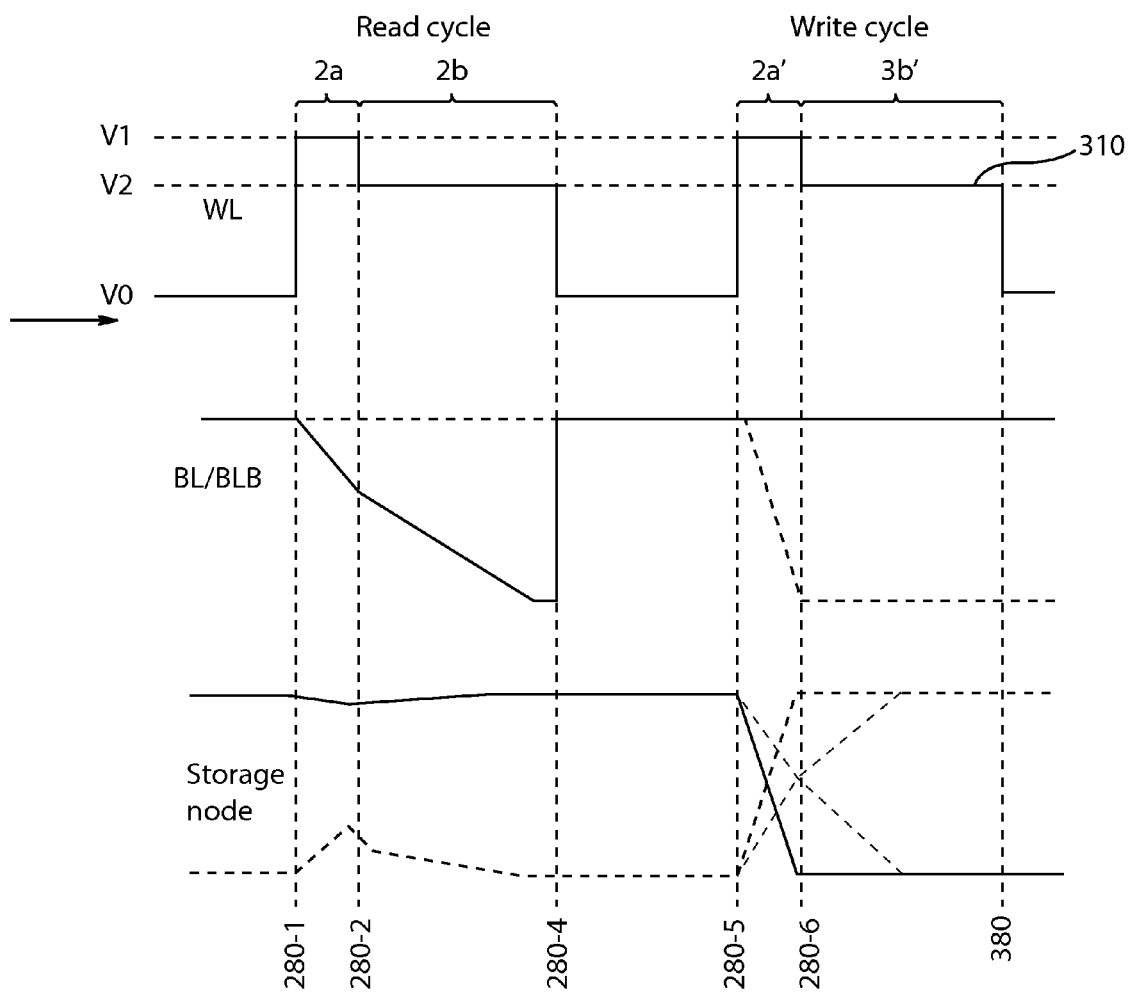
FIG. 3 is an example signal trace diagram for a word line, bit line, and storage nodes in accordance with another exemplary embodiment.
Figure 4:
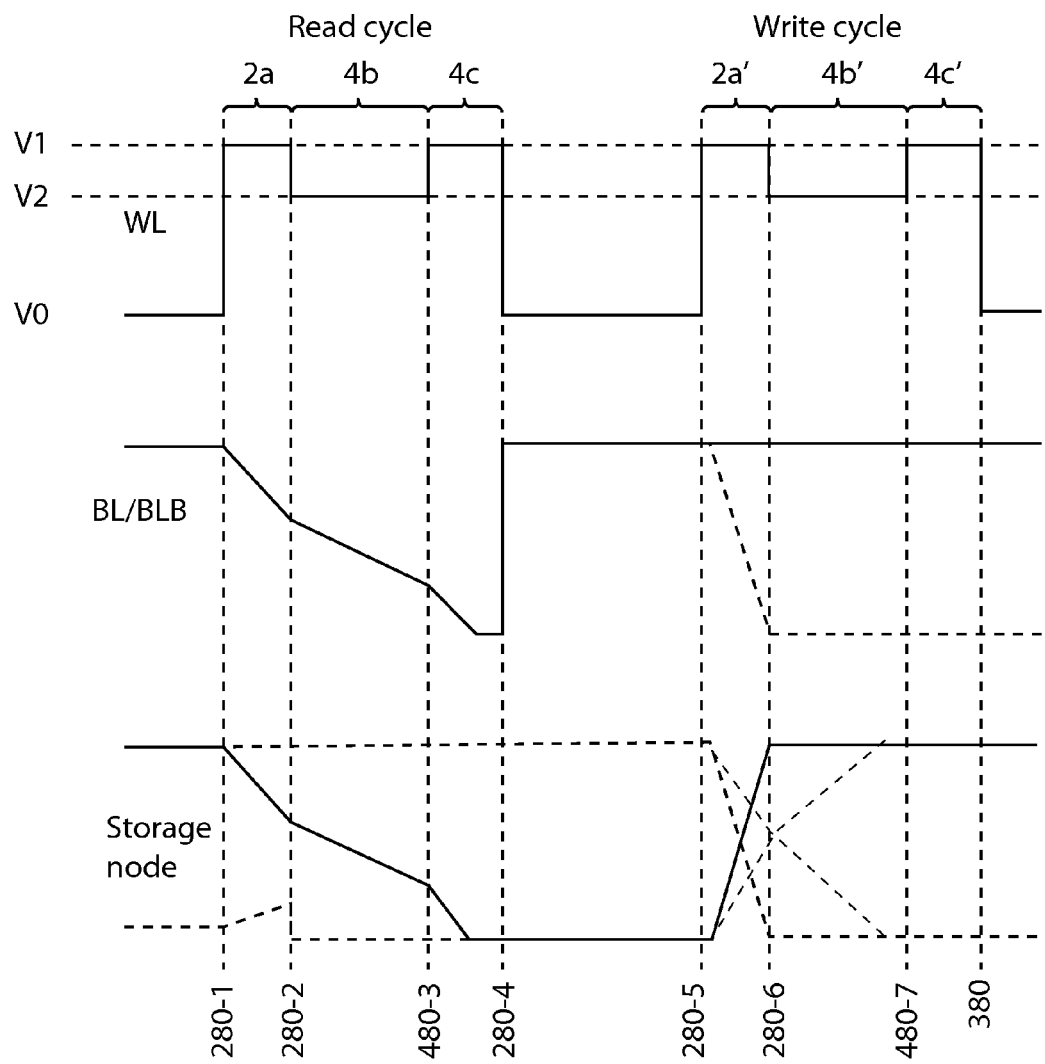
FIG. 4 is an example signal trace diagram for a word line, bit line, and storage nodes in accordance with another exemplary embodiment.

FIG. 2 is an example signal trace diagram showing signal levels for a word line 210, bit line 220, and storage nodes 230a, 230b, in accordance with an exemplary embodiment. Plot 210 shows voltage levels of word line WL at various times during read and write cycles; plots 220a and 220b show the voltages of bit lines BL and BLB, respectively; and plots 230a and 230b show the voltages at storage nodes Q and QB, respectively. BL and BLB may be precharged high (e.g., to a positive power supply voltage $V_{DD}$) before a read operation, and BL (plot 220a) is pulled low because a low value was stored at the bit cell. Initially, WL is at level V0, which may be a ground voltage $V_{SS}$. A read cycle starts at time 280-1 when WL is asserted to a positive level V1, which may be substantially equal to $V_{DD}$. This supply voltage $V_{DD}$ can be the high logic level supply to the SRAM as a whole, or a reduced supply voltage used as the supply to the bit cells, for example, to limit current leakage by operating the bit cells at a low voltage. Word line signal WL is maintained at the high level during an interval 2a between times 280-1 and 280-2. One of ordinary skill in the art understands that transitions from one logic level to another do not occur instantaneously in a real life implementation. The step function transitions in FIGS. 2-4 are for illustrative purposes.

The duration of interval 2a may be greater than ΔV, which is a sufficient signal difference for a sense amplifier used during the read operation to discern the logic state of the bit cell by responding to different voltages and different developing current conditions between the two bit lines BL and BLB. In some embodiments, ΔV may be about 100 mV. The duration of interval 2a may be less than a minimum cell flip time, which is the earliest time at which the bit cell can be expected in a case of substantial imbalance, for example due to inequality in FET threshold voltages, to possibly flip logic states (which is unintended behavior) during the read cycle. The voltages at storage nodes Q and QB, which are initially at opposite logic levels (one high and one low), may approach each other during and cross one another during a cell flip. In some embodiments, before the earliest possible time at which the voltages of the storage nodes cross each other, the voltage at WL is reduced to V2. In other words, before the bit cell is vulnerable to an unintended change of state, the voltage at WL is suppressed to avoid such a change of state. An imbalance of transistors of the inverters, or a level of energy associated with accessing the memory, or both, may contribute to a propensity for such a change of state. The minimum cell flip time may be determined empirically, e.g., via simulations or by testing. WL is maintained at V2 during interval 2b, which continues until the end of the read cycle at time 280-4. The signal at bit line BL is developed, and the sufficient difference in voltage ΔV between BL and BLB is developed, during the time between times 280-1 and 280-3. Under driving the WL signal (asserting WL at a suppressed level such as V2) during this interval prevents a read flip from occurring at the bit cell.

At the end of interval 2b, BL signal 220a may be precharged, along with BLB signal 220b, in preparation for a following read or write operation. During a write operation, a bit line corresponding to a column including a bit cell being written to may be pulled low, e.g., to $V_{SS}$.

The magnitude of the rate of change of the voltage of bit line BL and/or at the storage node with respect to time is reduced during the under-drive phase of interval 2b, as shown by the decreased magnitude of the slope of plot 220a corresponding to BL. With a steeper slope as in interval 2a that is due to a higher voltage applied to WL, the signal is developed faster, and the read may complete sooner. However, the impact on the rate of change of voltage of BL in some embodiments is better than with the prior art approach of under-driving WL to level V2 the entire time between times 280-1 and 280-4, which would also flatten the slope of plot 220a during interval 2a.

During a write cycle, WL is asserted at level V1 during interval 2a' between times 280-5 and 280-6. The duration of interval 2a' may be greater than a bit cell write contention time and may be less than or equal to a dummy cell flip time indicated by dashed lines 240a and 240b. Write contention time is the worst case time until the cross coupled inverters of a bit cell are forced into a stable new state, allowing for the possibility that the transistors in the inverters may be imbalanced (e.g., have different switching thresholds) within a predetermined level of tolerance. When a word line is asserted for a write operation, not all the bit cells coupled to the word line (i.e., not all the bit cells in the row associated with that word line) are written. Rather, through multiplexing, only one of the bit cells in a row of, e.g., 8 bit cells is written at a given time. For the other bit cells, a "dummy" read occurs during the write to the one bit cell in the row. To avoid a dummy cell flip at one of the cells that is not written, WL is de-asserted (returned to value that is substantially equal to V0) at time 280-6, which is no later than the earliest time at which the dummy cell flip may occur. A dummy cell flip may occur during a dummy read operation in which the WL is on for the unselected column and the bit lines are precharged to VDD but floating. Thus, dashed lines 240a and 240b show the voltage trajectory that would be taken for a dummy cell flip if not for the change in voltage level of WL to V0 at time 280-6. The dummy cell flip time may be determined empirically, e.g., via simulations or testing. WL is maintained at V0 at least until the end of the write cycle at time 280-7. Asserting WL at level V1 during interval 2a' advantageously does not impact the write margin. Typically, interval 2a' for a write cycle is longer in duration than interval 2a for a read cycle, although the intervals may have the same length in some embodiments.

The write to the bit cell occurs during interval 2a', i.e., storage nodes Q and QB reach their respective desired values by time 280-6 as shown by plots 230a and 230b. Various write assist schemes may be employed during interval 2a' as known in the art. For example, write assist schemes described in the following references may be used: Khellah et al., "Read and Write Circuit Assist Techniques for Improving Vccmin of Dense 6T SRAM Cell," ISBN No. 978-1-4244-1811-4 (IEEE 2008); and Pilo et al., "A 64 Mb SRAM in 32 nm High-k Metal-Gate SOI Technology with 0.7V Operation Enabled by Stability, Write-Ability and Read-Ability Enhancements," 2011 IEEE International Solid State Circuits Conference, ISBN No. 978-1-61284-302-5 (IEEE 2011).

FIG. 3 is a typical signal trace diagram for a word line, bit lines, and storage nodes in accordance with another exemplary embodiment. The left part of FIG. 3 corresponding to a read cycle is similar to the corresponding portion in FIG. 2 and does not require further description. The right side of FIG. 3 corresponding to a write cycle is different from FIG. 2 regarding the voltage plot 310 for the word line. After interval 2a' during which WL is asserted at level V1, the level of WL is reduced (suppressed) to V2 and maintained at that level during interval 3b' of the write cycle. During interval 3b', for dummy reads, BL and/or BLB continue developing. A storage node storing a value of '1' may continue pulling high, e.g., to a cell $V_{DD}$ ($CV_{DD}$), during interval 3b'. At time 380, the level of WL is changed to V0, in preparation for another memory access cycle.

As in FIG. 2, the word line suppression approach in FIG. 3 advantageously does not have a negative impact upon write margin. Due to maintaining WL at V2 during interval 3b' instead of changing WL to V0 at time 280-6 in FIG. 2, the technique corresponding to FIG. 3 provides greater tolerance regarding a write assist, namely applying a relatively higher voltage at WL so as to more forcefully impose the new logic value on the bit cell during a write operation than would be the case at a lower voltage at WL. In FIG. 2, a write assist occurs during interval 2a'. In FIG. 3, a write assist does not have to be as powerful as in FIG. 2, and the write does not have to occur as quickly, because WL is continued to be asserted at level V2 during interval 3b'. An upper bound on the end of interval 3b' (i.e., time 380) may be the end of the write cycle. In other words, in FIG. 3 a write finishes before time 380 but need not finish by time 280-6.

FIG. 4 is an example signal trace diagram for a word line, bit line, and storage nodes in accordance with another exemplary embodiment. In FIG. 4, assertion of WL at level V1 during the initial portion of the read cycle at interval 2a is similar to the functionality of FIG. 3. The voltage at WL is suppressed and maintained at level V2 during interval 4b. At time 480-3, the level of WL is increased, e.g., to V1, and is maintained at that level during interval 4c of the read cycle. Increasing the level of WL to V1 at time 480-3 works best, although a different increased level may be used as well. At time 280-4, the level of WL is adjusted to V0 in preparation for the next memory access cycle. In this example, word line suppression is similarly released at a terminal (end) portion of the write cycle, namely interval 4c'.

Under-driving the word line (e.g., suppressing it to level V2) consumes power in the disclosed embodiments, wherein the voltage applied to word line WL is pulled down by sinking current to ground from the supply to WL, and such power consumption may be a consideration in some contexts. For example, at decreasing frequencies, interval 4c (like interval 4c' of the write cycle) becomes increasingly long, which may result in high power consumption. Releasing suppression of the word line during a terminal portion of the read cycle reduces such power consumption unlike prior art techniques that employ a constant word line suppression level throughout read and write cycles.

In each of FIGS. 2-4, a read cycle and a write cycle are shown. The read cycles and write cycles may be performed at one bit cell, or at plural bit cells simultaneously or sequentially. A read cycle does not have to precede a write cycle, although that possibility is shown in these figures. The signaling shown during a read cycle followed by a write cycle, suggesting a repetitive advance through phases of read-write is for illustrative purposes only.

Figure 5:
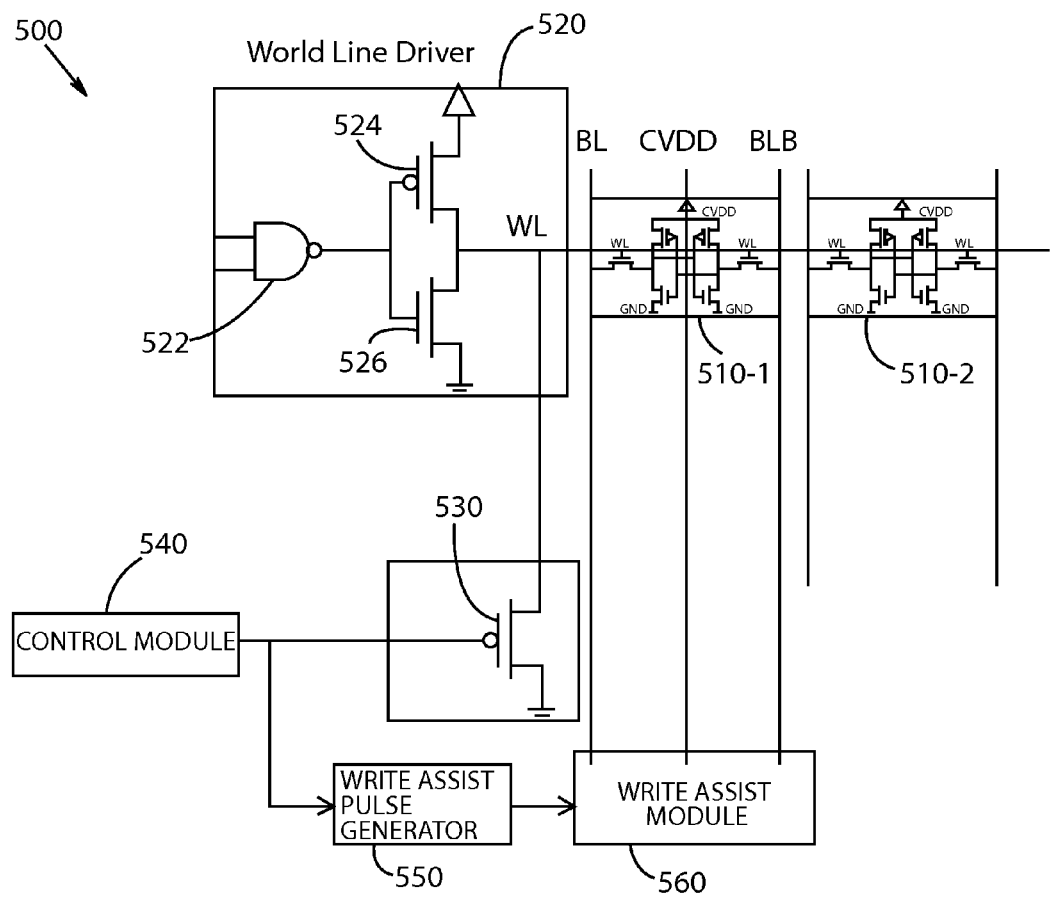
FIG. 5 is a schematic diagram of a static random access memory (SRAM) access assist apparatus in accordance with another exemplary embodiment.

FIG. 5 is a schematic diagram of a static random access memory (SRAM) access assist apparatus in accordance with another exemplary embodiment. An SRAM array includes bit cells 510-1 and 510-2 that are coupled to a word line WL and thus are in the same row of the SRAM. A cell $V_{DD}$ ($CV_{DD}$) line is coupled to bit cells in each column. The cell $V_{DD}$ may be a different voltage than the $V_{DD}$ supply voltage at other points in the SRAM device (e.g., to reduce leakage), such as where coupled to sense amplifiers, address decoding gating or other elements (not shown). Additional bit cells may be provided in this row and in other rows (with other associated word lines); FIG. 5 shows only two bit cells for convenience only. Each bit cell may have a structure similar to bit cell 100 of FIG. 1. A word line driver circuit 520 is configured to provide a word line signal at WL to drive a bit cell, e.g., bit cell 510-1, during a memory access cycle such as a read or write cycle. Circuit 520 may include a logic element, e.g., a NAND gate 522 that decodes an address based on an address input and a clock input, coupled to a CMOS inverter formed by a PMOS transistor 524 and an NMOS transistor 526 coupled to the word line as shown. A word line driver may implemented in other ways as well, which are apparent to those of ordinary skill in the art.

A switch 530 is configured to selectively couple the word line to a ground node. A control module 540 is configured to control switch 530 during a memory access cycle. The control module may include a timer configured to close switch 530 during a predetermined time interval during the access cycle, or a pulse generator configured to provide a periodic pulse, e.g., a clock signal, to the switch to suppress the word line signal. Control module 540 and switch 530 provide read assist functionality to selectively lower (suppress) the word line voltage in accordance with the examples shown in FIGS. 2-4. Each word line in the SRAM may have its own such control module and switch to support a read assist for that word line.

A write assist pulse generator 550 may generate a pulse for a write assist module 560, which is coupled to bit lines BL and BLB and to the cell power supply line $CV_{DD}$. These write assist components may support a write assist by various known techniques, e.g., the write assist techniques of Khellah or Pilo referenced above. For example, a negative bit line write assist may be used, or the $CV_{DD}$ voltage may be lowered by a write assist scheme.

Figure 6:
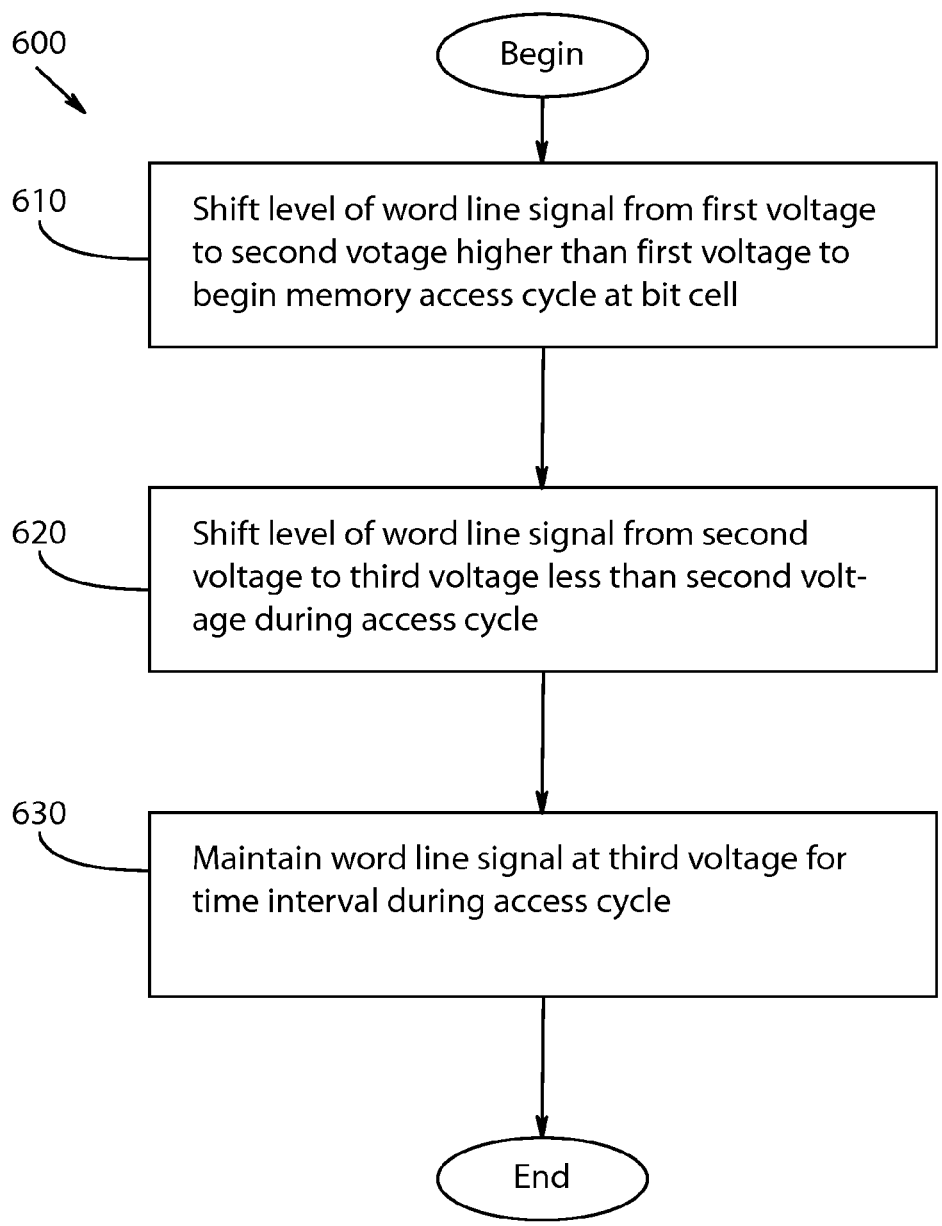
FIG. 6 is a flow diagram for a process in accordance with another exemplary embodiment.

FIG. 6 is a flow diagram for a process in accordance with another exemplary embodiment. Process 600 assists a memory access operation on a bit cell of a digital memory. The bit cell has cross coupled inverters configured for storing and retrieving a logic state via bit line connections through a word line controlling a passing gate transistor, i.e., coupled to the gate of an FET used as the passing gate transistor. After process 600 begins, a level of a word line signal controlling the passing gate transistor is shifted (610) from a first voltage value to a second voltage value higher than the first voltage value to begin a memory access cycle at the bit cell. The level of the word line signal is shifted (620) from the second voltage value to a third voltage value less than the second voltage value during the access cycle. The word line signal is maintained (630) at the third voltage value for a time interval during the access cycle.

Figure 7:
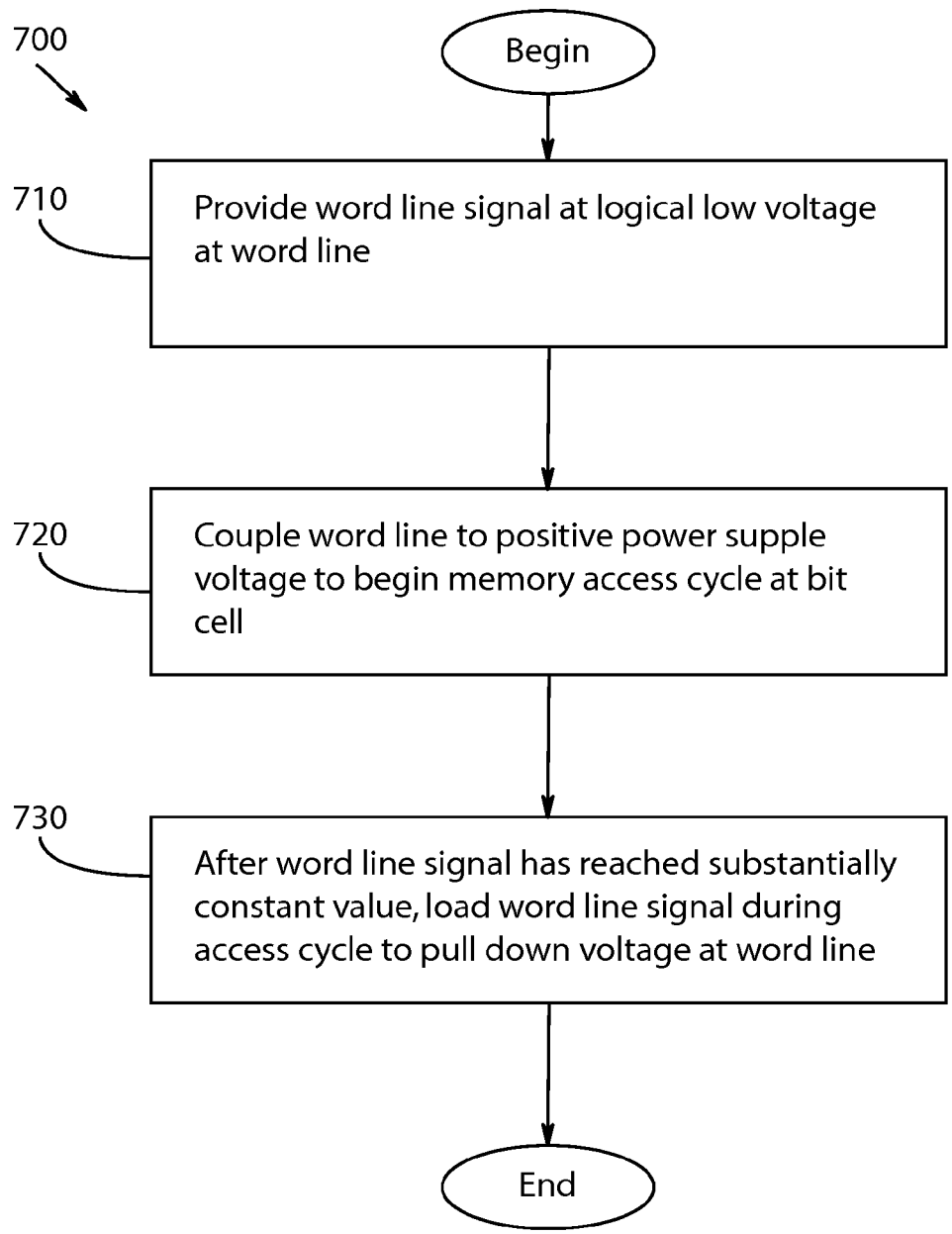
FIG. 7 is a flow diagram for a process in accordance with another exemplary embodiment.

FIG. 7 is a flow diagram for a process for controlling a signal in accordance with another exemplary embodiment. After process 700 begins, a word line signal is provided (710) at a logical low voltage at a word line. The word line is coupled (720) to a positive power supply voltage to begin a memory access cycle at a memory bit cell. After the word line signal has reached a substantially constant value, the word line signal is loaded (730) during the access cycle to pull down the voltage at the word line.

Although examples are illustrated and described herein, embodiments are nevertheless not limited to the details shown, since various modifications and structural changes may be made therein by those of ordinary skill within the scope and range of equivalents of the claims.

What is claimed is:

1. A method for assisting a memory access operation on a bit cell of a digital memory having cross coupled inverters biased by a supply voltage and configured for storing and retrieving a logic state via bit line connections through a passing gate transistor controlled by a word line, the method comprising:

shifting a level of a word line signal controlling the passing gate transistor from a first voltage value to a second voltage value higher than the first voltage value to begin a memory access cycle at the bit cell;

shifting the level of the word line signal from the second voltage value to a third voltage value less than the supply voltage and higher than the first voltage value during the access cycle; and maintaining the word line signal at the third voltage value for a time interval during the access cycle.

2. The method of claim 1, wherein the access cycle is a read cycle.

3. The method of claim 2, wherein a plurality of memory bit cells are responsive commonly to the word line signal;

further comprising shifting the level of the word line signal from the first voltage value to the second voltage value to begin a memory write cycle at one of the plurality of memory bit cells;

shifting the level of the word line signal from the second voltage value to the third voltage value during the write cycle; and maintaining the word line signal at the third voltage value for a time interval during the write cycle.

4. The method of claim 3, wherein the level of the word line signal is shifted from the first voltage value to the second voltage value, and from the second voltage value to the third voltage value, at the same said bit cell during the read and write cycles.

5. The method of claim 3, further comprising maintaining the word line signal at the second voltage value for equal time durations during the read and write cycles.

6. The method of claim 5, wherein the level of the word line signal is shifted from the second voltage value to the third voltage value at a time preceding a time point at which the inverters of the bit cells are vulnerable to a change of state.

7. The method of claim 6, wherein at least one of an imbalance of transistors of the inverters and a level of energy associated with accessing the memory contributes to a propensity for said change of state.

8. The method of claim 1, wherein the access cycle is a write cycle.

9. The method of claim 8, wherein the third voltage value is greater than the first voltage value whereby the word line signal is suppressed to the third voltage value to maintain the passing gate transistor in a conducting state.

10. The method of claim 1, further comprising shifting the level of the word line signal from the third voltage value to the second voltage value during the access cycle.

11. The method of claim 1, further comprising shifting the level of the word line signal from the third voltage value to the first voltage value before an end of the access cycle.

12. The method of claim 1, wherein the time interval exceeds in duration another interval corresponding to a switching threshold of a sense amplifier used for the access cycle.

13. The method of claim 1, wherein the second voltage value is the supply voltage.

14. A static random access memory (SRAM) access assist apparatus comprising:

a first bit cell of a static random access memory (SRAM) including cross coupled inverters configured for storing and retrieving a logic state, the inverters biased by a supply voltage;

a word line coupled to said first bit cell, wherein the first bit cell is accessible via bit line connections through a passing gate transistor of the first bit cell controlled by said word line;

a word line driver circuit configured to provide a word line signal at said word line to drive said first bit cell during a memory access cycle;

a switch configured to selectively load said word line to a ground node; and a control module configured to control said switch during the access cycle, the control module configured to open said switch during a first time interval of the access cycle and close said switch to suppress the word line signal during a second time interval of the access cycle after the first time interval, wherein the value of the word line signal during the second time interval is lower than the supply voltage and higher than a ground voltage.

15. The apparatus of claim 14, wherein the access cycle is a read cycle.

16. The apparatus of claim 14, wherein the access cycle is a write cycle.

17. The apparatus of claim 14, wherein said control module is further configured to open said switch during a third time interval of the access cycle after the second time interval.

18. The apparatus of claim 14, wherein said bit cell comprises a pair of inverters cross-coupled at a pair of nodes, and a pair of passing gate field effect transistors responsive to the word line signal for coupling a pair of bit lines to respective nodes.

19. A method of controlling a signal, the method comprising:
   biasing cross coupled inverters of a memory bit cell with a positive power supply voltage;
   providing a word line signal at a logical low voltage at a word line;
   coupling the word line to the positive power supply voltage to begin a memory access cycle at the memory bit cell;
   after the word line signal has reached the positive power supply voltage, loading the word line signal during the access cycle to pull down the voltage at the word line to a voltage value higher than the logical low voltage, wherein the word line is maintained at said voltage value higher than the logical low voltage until the end of the access cycle.

20. A method for assisting a memory access operation on a bit cell of a digital memory having cross coupled inverters configured for storing and retrieving a logic state via bit line connections through a passing gate transistor controlled by a word line, the method comprising:
   shifting a level of a word line signal controlling the passing gate transistor from a first voltage value to a second voltage value higher than the first voltage value to begin a memory access cycle at the bit cell, wherein the second voltage value is a positive power supply voltage;
   shifting the level of the word line signal from the second voltage value to a third voltage value higher than the first voltage value and less than the second voltage value during the access cycle; and
   maintaining the word line signal at the third voltage value until the end of the access cycle.

21. A static random access memory (SRAM) access assist apparatus comprising:
   a first bit cell of a static random access memory (SRAM) including cross coupled inverters configured for storing and retrieving a logic state;
   a word line coupled to said first bit cell, wherein the first bit cell is accessible via bit line connections through a passing gate transistor of the first bit cell controlled by said word line;
   a word line driver circuit configured to provide a word line signal at said word line to drive said first bit cell during a memory access cycle;
   a switch configured to selectively load said word line to a ground node; and
   a control module configured to control said switch during the access cycle, the control module configured to open said switch during a first time interval of the access cycle and close said switch to suppress the word line signal to a voltage less than a positive power supply voltage and higher than a ground voltage during a second time interval extending until the end of the access cycle.

* * * * *